(12) United States Patent  
Chang et al.

(10) Patent No.: US 7,923,069 B2  
(45) Date of Patent: Apr. 12, 2011

(54) MULTI-STATION DEPOSITION APPARATUS AND METHOD

(75) Inventors: Mei Chang, Saratoga, CA (US);  
Lawrence C. Lei, Milpitas, CA (US);  
Walter B. Glenn, Pacifica, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 12/860,542

(22) Filed: Aug. 20, 2010

(65) Prior Publication Data

US 2010/0316800 A1    Dec. 16, 2010

Related U.S. Application Data

(60) Division of application No. 12/435,950, filed on May 5, 2009, now Pat. No. 7,794,789, which is a continuation of application No. 11/198,140, filed on Aug. 5, 2005, now Pat. No. 7,547,465, which is a division of application No. 10/124,309, filed on Apr. 16, 2002, now Pat. No. 6,932,871.

(51) Int. Cl.  
*C23C 16/00* (2006.01)

(52) U.S. Cl. ............... 427/248.1; 427/255.28; 427/251; 427/255.5

(58) Field of Classification Search ............... 427/255.5, 427/251, 255.28, 248.1; 118/720, 719; 156/345.31  
See application file for complete search history.

(56) References Cited

U.S. PATENT DOCUMENTS

| | | | |
|---|---|---|---|
| 5,916,365 | A | 6/1999 | Sherman |
| 6,026,589 | A | 2/2000 | Yao et al. |
| 6,042,652 | A | 3/2000 | Hyun et al. |
| 6,139,700 | A | 10/2000 | Kang et al. |
| 6,143,082 | A | 11/2000 | McInerney et al. |
| 6,143,659 | A | 11/2000 | Leem |
| 6,174,377 | B1 | 1/2001 | Doering et al. |
| 6,203,613 | B1 | 3/2001 | Gates et al. |
| 6,206,967 | B1 | 3/2001 | Mak et al. |
| 6,319,553 | B1 | 11/2001 | McInerney et al. |
| 6,342,277 | B1 | 1/2002 | Sherman |

(Continued)

FOREIGN PATENT DOCUMENTS

JP    63-266072 A    1/1988

(Continued)

OTHER PUBLICATIONS

Klaus, et al., "*Atomically controlled growth of tungsten and tungsten nitride using sequential surface reactions*," Applied Surface Science 162-163 (2000) 479-491.

*Primary Examiner* — Roberts Culbert  
(74) *Attorney, Agent, or Firm* — Patterson & Sheridan, LLP

(57) ABSTRACT

A multi-station deposition apparatus capable of simultaneous processing multiple substrates using a plurality of stations, where a gas curtain separates the stations. The apparatus further comprises a multi-station platen that supports a plurality of wafers and rotates the wafers into specific deposition positions at which deposition gases are supplied to the wafers. The deposition gases may be supplied to the wafer through single zone or multi-zone gas dispensing nozzles.

10 Claims, 10 Drawing Sheets

U.S. PATENT DOCUMENTS

| | | |
|---|---|---|
| 6,541,353 B1 * | 4/2003 | Sandhu et al. ............... 438/478 |
| 6,576,062 B2 * | 6/2003 | Matsuse ...................... 118/719 |
| 6,627,558 B2 * | 9/2003 | Rose ........................... 438/747 |
| 2001/0024387 A1 | 9/2001 | Raaijmakers et al. |
| 2001/0041250 A1 | 11/2001 | Werkhoven et al. |
| 2001/0054769 A1 | 12/2001 | Raaijmakers et al. |

FOREIGN PATENT DOCUMENTS

| | | |
|---|---|---|
| JP | 2060944 A | 3/1990 |
| WO | WO-0127346 A1 | 4/2001 |
| WO | WO-0127347 A1 | 4/2001 |
| WO | WO-0129891 A1 | 4/2001 |
| WO | WO-0129893 A1 | 4/2001 |

* cited by examiner

MULTI-STATION DEPOSITION APPARATUS AND METHOD

CROSS-REFERENCE TO RELATED APPLICATION

This application is a divisional of U.S. patent application Ser. No. 12/435,950, filed May 5, 2009 now U.S. Pat. No. 7,794,789, which is continuation of U.S. patent application Ser. No. 11/198,140, filed Aug. 5, 2005 now U.S. Pat. No. 7,547,465, which is a divisional of U.S. patent application Ser. No. 10/124,309, filed on Apr. 16, 2002 now U.S. Pat. No. 6,932,871. Benefit of priority to all of the above referenced applications is claimed. Additionally, all of the above referenced applications are herein incorporated by reference in their entireties.

BACKGROUND OF THE INVENTION

1. Field of the Invention

The present invention relates to chemical vapor deposition processes. More particularly, the invention relates to a multi-station deposition apparatus and method.

2. Description of the Background Art

As the size of integrated circuit (IC) devices decreases, the deposition techniques used to form very thin films on substrates has become the focus of much interest. To deposit thin films into ultra-high aspect ratio vias and trenches (e.g., aspect ratios on the order of 20:1), atomic layer deposition (ALD) has been used.

An ALD technique deposits a thin film having a thickness of less than 50 Å by alternating the supply of reactant gases and purging gases. Each reactant gas is adsorbed onto the wafer as a monolayer, i.e., a layer being substantially one atom thick. The monolayers of various reactant gas react with one another to form a thin film. A thin film having a high aspect ratio, good uniformity, as well as good electrical and physical properties can be formed using an ALD process. Also, the ALD films have a lower impurity density than those formed by other deposition methods.

ALD generally involves positioning a wafer in a chamber, generating a vacuum in the chamber, and applying certain reactant gases in short bursts (or pulses) to form a thin film upon the substrate. A purge gas may be applied in between reactant gas bursts. Each burst results in the adsorption of a monolayer of gas. The application of gas bursts may be repeated to deposit a thicker film. Once a film of desired thickness is formed, a purge gas is used to remove residual reactant gases from the chamber, the chamber vacuum is released, and the wafer is removed from the chamber.

In one particular example of ALD, a thin tungsten layer may be formed by alternately pulsing silane ($SiH_4$) gas and tungsten hexafluoride ($WF_6$) gas into a chamber. The reaction between the adsorbed gases on the surface of the wafer produces a thin tungsten film. After the thin layer is formed, hydrogen-reduced tungsten hexafluoride can be used to "bulk fill" tungsten onto the nucleation layer. Such an ALD-based process results in very good step coverage of ultra-high aspect ratio trenches and vias.

One method believed to overcome the inherent slowness of an ALD process is a batch process that simultaneously processes many wafers. Some batch processes involve stacks of processing zones having multiple wafers placed in the zones. Within each zone, a laminar flow of reactant gases is supplied over each wafer in the stack. Although effective at simultaneously processing multiple wafers, the stacked zone processing technique has limited throughput.

Therefore, there is a need in the art for a method and apparatus for ALD processing of multiple wafers simultaneously such that wafer throughput is improved.

SUMMARY OF THE INVENTION

The present invention is a method and apparatus for performing atomic layer deposition (ALD) processes or chemical vapor deposition (CVD) processes upon multiple wafers simultaneously.

In one embodiment, the multi-wafer deposition apparatus comprises a series of deposition stations that are positioned upon a rotating platen. Above each station on the rotatable platen is at least one gas delivery nozzle or showerhead that dispense reactant gases. The nozzles at each station supply gases that perform the various stages of the deposition process to form a particular film or film combination upon a wafer. Each station is separated from other stations by a gas curtain. The gas curtains produce a barrier to inhibit reactant gases used in one station from passing to an adjacent station.

In operation, a wafer is positioned on a wafer support in a first station using a wafer transfer robot. A gas nozzle (or showerhead) dispenses a first reactant gas into a region above the wafer such that the first reactant gas is adsorbed upon the wafer. A burst of the first reactant gas may be followed by a burst of purge gas. Alternatively, the purge gas may be continuously supplied to the nozzle and a burst of reactant gas may be inserted into the purge gas flow. The purge gas removes any residual reactant gas that was not adsorbed onto the wafer. The first reactant gas is constrained to the first station by gas curtains formed on either side of the wafer support. The curtains form radials from a center hub of the rotatable platen to the edge of the platen. An inert purge gas is used to form the curtains.

Next, the platen is rotated to position the wafer in the first station beneath a second nozzle that supplies another reactant gas. A pulse of the second reactant gas is applied to the wafer and the second reactant gas reacts with the first reactant gas to form a layer of material. Such a deposition process forms a thin layer (sometimes referred to as a monolayer) in an atomic layer deposition (ALD) mode.

While the first station is receiving the second gas at the second platen position, a second wafer can be placed in a second station on the platen and have the first reactant gas applied thereto. At each platen position, the wafer temperature can be adjusted to optimize the reaction and/or adsorption that is to occur at that position. The same reactant gases may be applied from additional nozzles such that the film can be increased in thickness. Alternatively, the wafers can be repeatedly returned to the first two nozzles to increase the film thickness, leaving other nozzles for other gases, e.g., bulk fill gases.

In another alternative embodiment, each station may be used to deposit multiple gases either sequentially or simultaneously such that the apparatus deposits material in a chemical vapor deposition mode. If the gases are supplied sequentially, a purge gas may be supplied to the wafer in between each of the applications of reactant gas. To facilitate dispensing one or more gases in a station, a multi-zone nozzle is used. A multi-zone nozzle comprises a plurality of conduits that each couple to a plenum and each plenum provides gas to a disbursement port.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION

Figure 1:
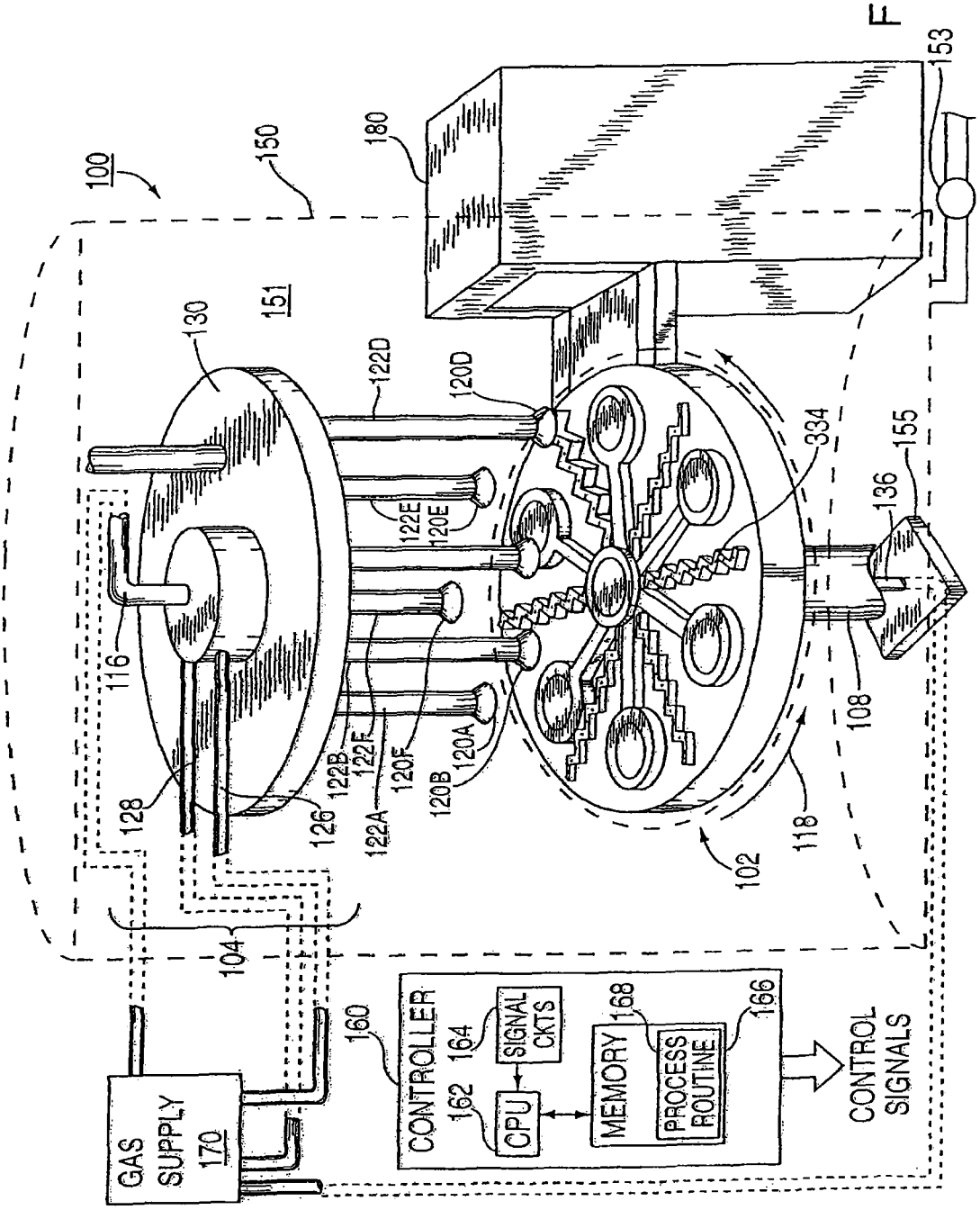
FIG. 1 is a perspective view of an embodiment of a deposition apparatus according to the present invention.
Figure 2:
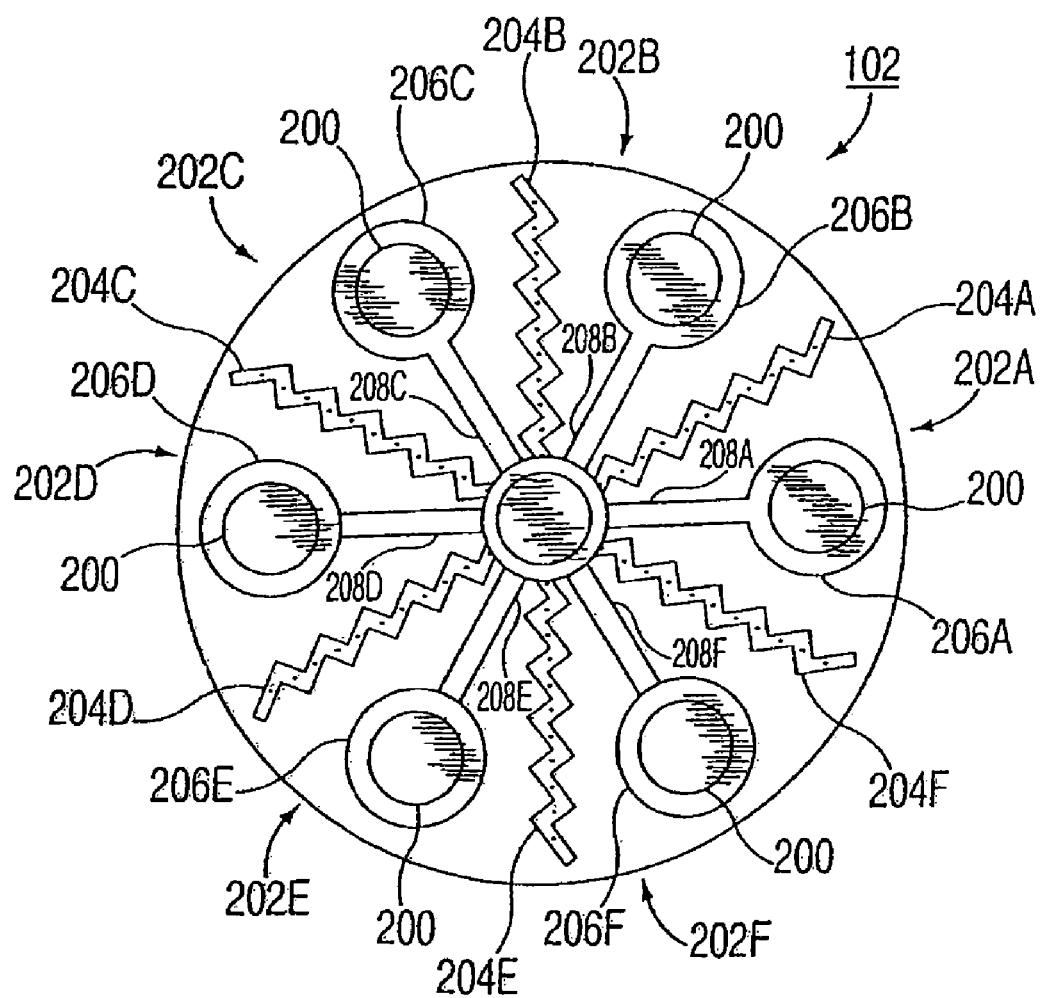
FIG. 2 is a top plan view of a rotatable platen used in the apparatus of FIG. 1.

FIG. 1 is a perspective view of an embodiment of a deposition apparatus 100 according to the present invention. While FIG. 1 provides an illustration of the entire embodiment, FIG. 2 depicts a top plan view of a rotatable platen 102 so as to clearly depict the plurality of deposition stations, 202A-202F within the apparatus 100. To best understand the invention, FIGS. 1 and 2 should be viewed simultaneously. The apparatus 100 comprises a chamber 150, a gas supply 170 for supplying gases to the chamber 150, a gas dispensing system 104 for dispensing gases, and a wafer platen 102 for supporting wafers 200 in the chamber 150 during processing. The apparatus 100 is controlled by a controller 160. Although the embodiments of the invention described herein are discussed with respect to semiconductor wafer processing, other substrates may be processed in lieu of semiconductor wafers.

To supply wafers to the apparatus 100, a wafer transfer module 180 communicates with the apparatus 100. The wafer transfer module 180 comprises a loadlock and a wafer transfer robot. The details of the wafer transfer module 180 are not shown, since module 140 does not form a part of the present invention. The loadlock accepts wafers from a factory interface and temporarily stores the wafers prior to and after processing. A wafer transfer robot moves the wafers from the load lock into the stations 202A-202F for processing. To facilitate wafer access to the chamber 150, the chamber wall contains a slit valve or other form of portal.

The chamber 150 defines a volume 151 within which a partial vacuum is maintained during wafer processing. The vacuum is created in a well-known manner by at least one vacuum pump 153. The chamber 150 has a substantially cylindrical shape and houses the gas dispensing system 104 and the wafer platen 102.

The platen 102 is, in one embodiment, circular in shape having a point of rotation disposed in the center of the platen 102. The platen 102 is fixed in the horizontal and vertical planes and rotates about its central axis in the horizontal plane. The platen 102 is subdivided into wedge-shaped segments by purge gas curtain distributors 204A-204F. These segments are referred to herein as stations 202A-202F. Each of the curtain distributors 204A-204F produce a vertical curtain of purge gas that isolates the gases used at any one instant within any one station from adjacent stations.

Each station 202A-202F comprises a wafer support 206A-206F. The wafer supports 206A-206F are arranged in an equidistantly spaced circular pattern about the hub 117. The wafer supports 206A-206F are affixed to the hub 117 by a plurality of radial arms 208A-208F. The radial arms 208A-208F contain wires that supply electrical signals to the support pedestals 206A-206F. The wafer supports 206A-206F may be wafer pedestals that retain the wafer using mechanical clamp rings, vacuum chucks, or electrostatic chucks. Additionally, each individual support may contain a wafer thermal control (heating and/or cooling) element. As such, the wafer temperature may be independently adjusted at each process position as the platen is rotated.

An actuator 155 causes the platen to move relative to the gas dispensing system 104. In one embodiment, the platen 102 may be caused to rotate by a direct drive motor, a concentric drive hub mechanism, a geared hub, a belt driven hub mechanism, or any technique commonly known in the art for obtaining rotation of an object. The direction of rotation of the platen 102 is indicated by the arrows 118. To facilitate rotation, the platen 102 is mounted to a platen support 108 that is coupled to an actuator 155. In alternative embodiments, as discussed below, the gas dispensing system 104 may be caused to rotate or both the platen 102 and the gas dispensing system 104 may be caused to simultaneously rotate.

A gas dispensing system 104 is disposed directly above the platen 102 and is generally supported by the top of chamber 150. The system 104 is supplied various gases from the gas supply 170 via gas lines 116, 126 and 128. The gas dispensing system 104 comprises a plurality of nozzle assemblies 120A-120F that are coupled to a gas distribution manifold 130. The gas dispensing system 104 distributes gases to the nozzle assemblies 120A-120F from the various reactant gas lines 126 and 128 as well as the purge gas lines 116.

As is discussed in detail with respect to FIGS. 3, 4 and 5 below, gases are carried by the gas lines 126, 128 and 116 to the gas distribution manifold 130. The gas distribution manifold 130 distributes gases to the nozzle assemblies 120A-120F. As discussed further below, the manifold 130 could supply reactant gases sequentially to each of the nozzles or the manifold 130 could simultaneously supply a plurality of gases to each nozzle.

The apparatus 100 is controlled by controller 160. Controller 160 comprises a central processing unit (CPU) 162, a memory 164 and support circuits 166. The CPU 162 is a microprocessor or microcontroller that executes software stored in the memory 166 to produce control signals for the apparatus 100. The control signals include, but are not limited to, gas pulse timing, gas pressure control, platen rotation control, wafer ingress and egress, wafer temperature, and the like. The CPU 162 is coupled to various well-known support circuits 164 that include cache, power supplies, input/output circuits, clock circuits and the like. The memory 166 may include at least one of random access memory, read only memory, removable storage, disk drives and the like. The memory 166 stores software such as process routine 168 that is executed by the CPU to cause the ALD apparatus 100 to perform various processes and methods in accordance with the invention.

Figure 3:
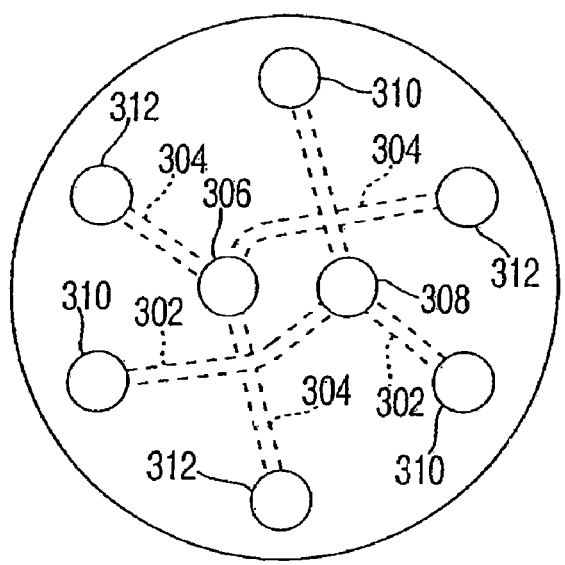
FIG. 3 is a plan view of a gas distribution manifold.
Figure 4:
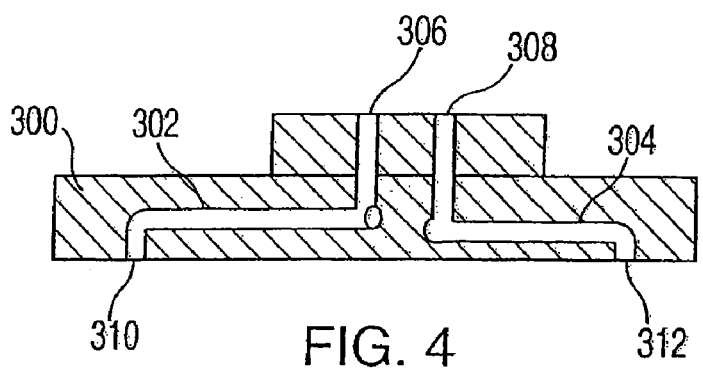
FIG. 4 is a cross-sectional view of the gas distribution manifold of FIG. 3 taken a long line 4-4.

FIG. 3 depicts a bottom plan view of one embodiment of a gas distribution manifold 130 and FIG. 4 depicts a cross-section of the manifold 130 taken along line 4-4 in FIG. 3. The manifold 130 comprises a distribution plate 300 defining a plurality of conduits 302 and 304 that connect the reactant gas lines 126 and 128 to the nozzle assemblies 120A-120F. The conduits 302 and 304 extend radially from the inlet ports 306 and 308 to the outlet ports 310 and 312. The conduits 302 and 304 are fabricated at different levels within the plate 300 to maintain isolation of the gases that are carried to each station. A third inlet port (not shown) may be used to supply a purge gas from the purge gas line 116 to one or more of the nozzle assemblies. Alternatively, the purge gas may be coupled to either port 306 or 308, or both, using a valve within the gas supply 170. As such, purge gas could be continuously supplied and reactant gas could be "switched" in using a valve to form a burst of reactant gas in the purge gas flow. In a further alternative embodiment, each individual nozzle assembly could be supplied with a different gas, i.e., six inlet ports could be coupled to six outlet ports to supply a different gas to each of the six nozzle assemblies 120A-120F. The manifold can be designed to couple any number of reactant and purge gas conduits to any number of outlet ports.

Figure 5:
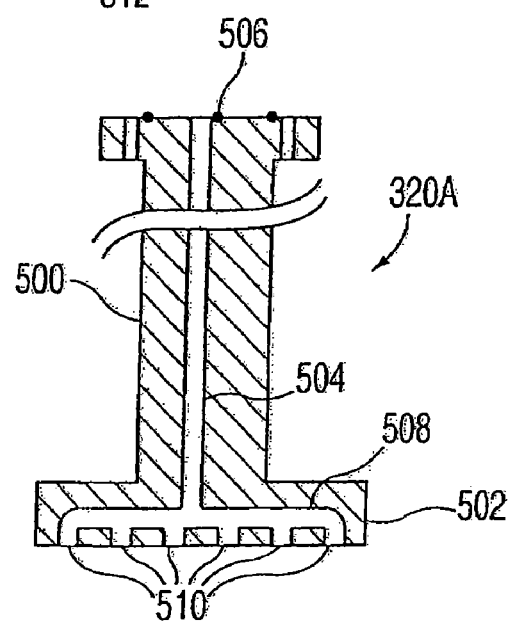
FIG. 5 is a cross-sectional view of a showerhead.

FIG. 5 depicts a cross-sectional view of a nozzle assembly, e.g., assembly 120A. The nozzle assembly 120A comprises a conduit 500 and a showerhead 502. The conduit 500 defines a bore 504 that extends the length of the conduit and sealably couples to outlet port (310 or 312 of FIG. 3). The conduit is generally bolted to the manifold 300 using an O-ring 506 to form a gas tight seal between the conduit 500 and the manifold 300. Other techniques for attaching the nozzle assembly 120A to the manifold 300 are readily available and known to those skilled in the art. The showerhead 502 comprises a plenum 508 for distributing gas from the bore 504 to a plurality of apertures 510. The pattern of the apertures 510 is designed to uniformly supply gas across a wafer (as discussed below). In some embodiments of the invention, a showerhead may not be used and the bore 504 may be terminated with a spray nozzle.

Figure 9:
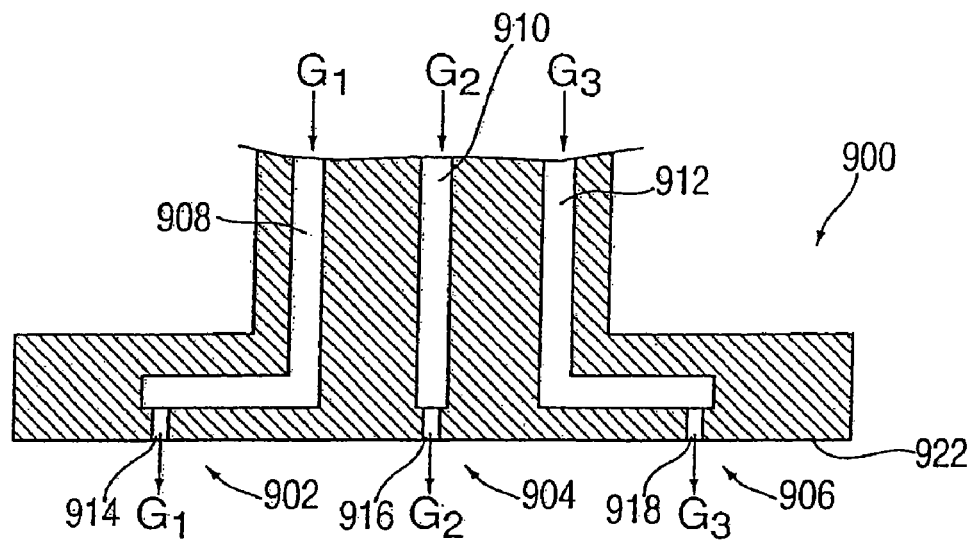
FIG. 9 is a cross sectional view of another embodiment of a nozzle—specifically a multi-zone nozzle.
Figure 10:
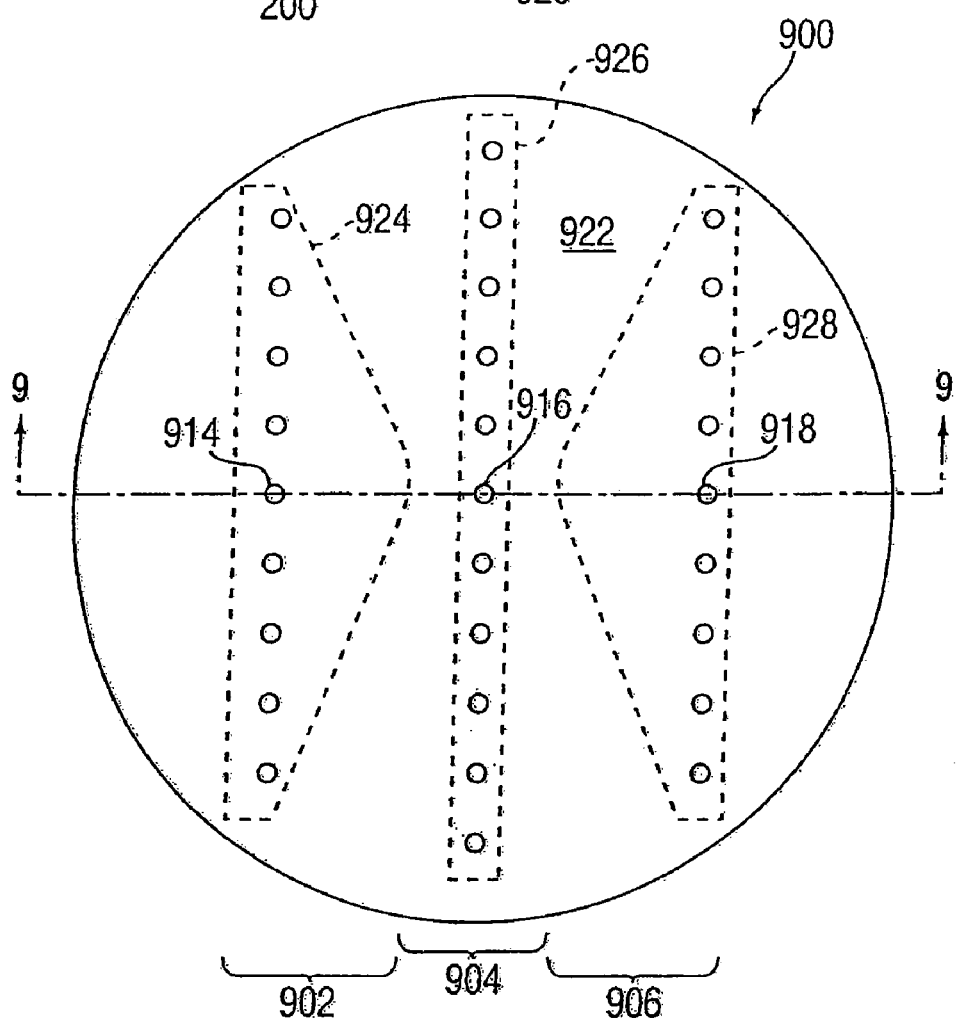
FIG. 10 is a plan view of one embodiment for the multi-zone nozzle of FIG. 9.

FIG. 9 depicts a vertical, cross-sectional view of another embodiment of a nozzle 900 and FIG. 10 depicts a plan view of the nozzle 900. The nozzle 900 comprises a plurality of zones 902, 904, 906 through which different gases may be dispensed. In some instances, such as in a CVD mode that will be discussed with reference to FIG. 12 below, all the zones may supply the same gas to a processing station.

Each zone 902, 904, and 906 comprises a plurality of conduits 908, 910, and 912 that are each coupled to respective plenums (shown in phantom as 924, 926, and 928) that distribute gas to at least one respective port 914, 916, 918 located in the faceplate 922. Gases that are supplied by a manifold (similar to the manifold in FIGS. 3 and 4 that has been adapted to distribute a plurality of gases to the nozzles) to each conduit 908, 910 and 912 flows to the port(s) 914, 916 and 918 in each respective zone 902, 904, and 906 without mixing. Although the embodiment shown has a plurality of ports linearly arranged in each zone, other arrangements such a single port having a circular or rectangular shape (i.e., a slot), a two dimensional array of ports, combinations of port shapes and the like may be used and are considered to be within the scope of the invention. Furthermore, the embodiment shown depicts three zones, however, more or less zones are contemplated as being within the scope of the invention. Also, each zone may have a different shape or size of the port arrangement to tailor the ports to the type of gas and a desired gas disbursement pattern.

In operation, the wafer 200, positioned on the rotating platen, moves in a direction represented by arrow 920 beneath the nozzle 900. In this manner, as few as a single multi-zone nozzle can be used to deposit a film upon a plurality of wafers. However, to increase wafer throughput a plurality of nozzles is generally used.

As a wafer moves beneath the nozzle 900, the gas $G_1$ from port 914 is adsorbed by the wafer 200 as the wafer passes beneath the port 914. The amount of gas applied to the wafer is defined by the speed of rotation of the platen. As the wafer moves beneath port 916, a second gas $G_2$ is applied to the wafer. Then, as the wafer 200 moves beneath port 918, a third gas $G_3$ is applied to the wafer. In one embodiment of the invention, gases $G_1$ and $G_3$ are reactive gases and gas $G_2$ is a purge gas. If, for example, gas $G_1$ were silane, gas $G_3$ were tungsten hexafluoride and gas $G_2$ was Argon, then gas $G_1$ would be adsorbed first, gas $G_2$ would remove any excess silane from the wafer surface, and lastly gas $G_3$ would provide tungsten to react with the silane to form a thin tungsten film on the wafer. A detailed process description is described with respect to FIG. 13 below.

Figure 11:
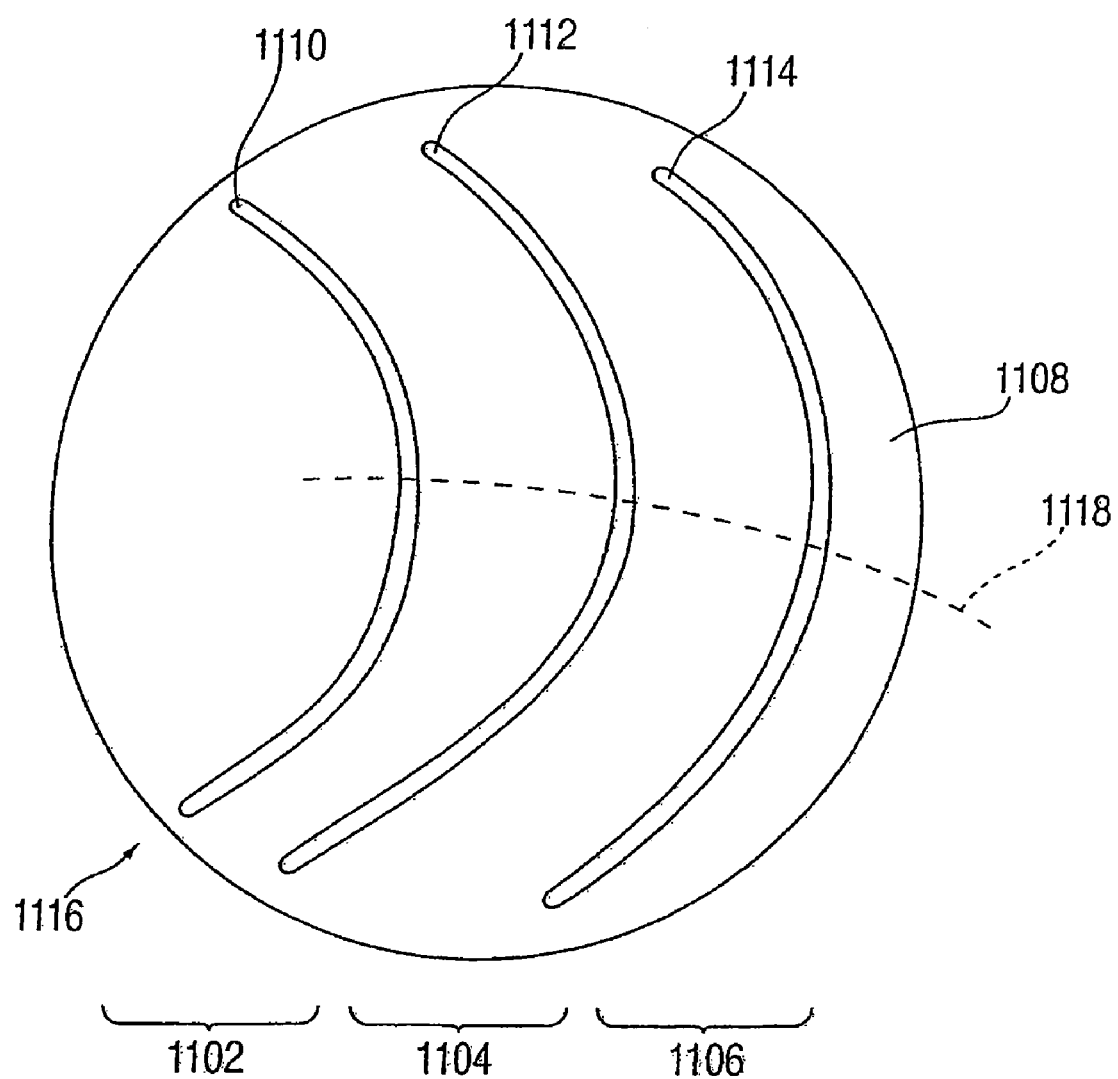
FIG. 11 is a plan view of an alternative embodiment of the multi-zone nozzle of FIG. 9.

FIG. 11 depicts a plan view of another embodiment of a faceplate 1108 of a nozzle 1116. In this embodiment, each gas exits the faceplate 1108 through zones 1102, 1104, and 1106 defined by gas disbursement channels 1110, 1112, and 1114. The channels 1110, 1112, and 1114 are arcuate, where the arc of each channel is similar to the arc of the edge of a substrate (wafer) that is being processed. The peak of each arc (along line 1118) is aligned with the path of the wafer beneath the nozzle 1116 on the rotating platen. Such arcuate channels 1110, 1112 and 1114 are intended to supply gas uniformly to the substrate such that all points on the substrate in an arcuate swath are exposed to the gas simultaneously. As with the previous embodiment, the disbursement channels are merely examples of a type of distribution ports. Those skilled in the art will understand that the channels could be replaced with holes, arrays of holes, holes of various shapes, or combination of holes and channels. The size and shape of each zone may be tailored to the dispersion rate, adsorption dynamics, process parameters, device or substrate topography and gas residence times desired for each particular gas.

Figure 12:
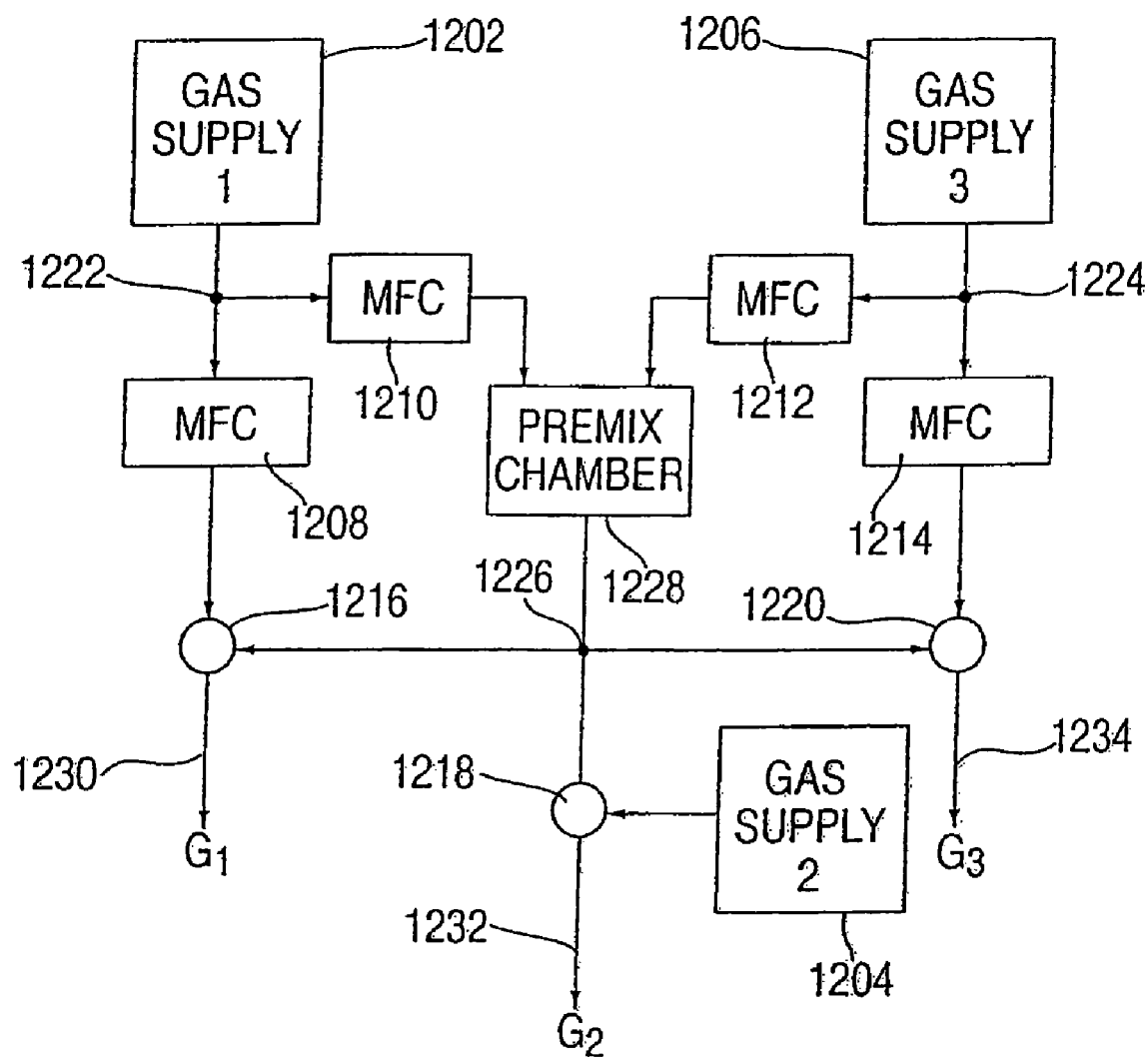
FIG. 12 is a block diagram of a gas delivery system for a multi-zone nozzle of FIG. 9.

FIG. 12 depicts a dual plumbed, gas distribution system 1200 to be used with the multi-zone gas nozzles 900/1116. The system 1200 comprises three gas supplies 1202, 1204, and 1206, a plurality of mass flow controllers (MFC) 1208, 1210, 1212 and 1214, a plurality of two position valves 1216, 1218, 1220, a plurality of gas splitters 1222, 1224, and 1226 and a premix chamber 1228. The intent of the system is to permit gases from each supply 1202, 1204 and 1206 to be provided to the lines 1230, 1232, and 1234 that carry gas to the nozzles 900/1116 as well as allowing premixed combinations of gases to be provided to one or more of the lines 1230, 1232, 1234. For example, a single gas can be supplied to each line in an ALD mode or a premixed combination of gases may be simultaneously supplied to all the lines in a CVD mode.

In an ALD mode, gas from supply 1202 is coupled through a gas splitter (a T-coupler) 1222 to the MFC 1208. The MFC 1228 meters the amount of gas that is supplied to the two-position valve 1216. In a first position, the valve 1216 directs the gas from the MFC 1208 to the line 1230. Similarly, in an ALD mode, gas supply 1206 provides gas through the MFC 1214 to the two-position valve 1220 and to line 1234. Also in the ALD mode, gas supply 1204 is coupled through a two-position valve 1218 to line 1232. In this manner, metered amounts of gas are supplied separately to each zone of the nozzles. The dosing of the wafer can be synchronized with the rotation of the platen. As is described further with reference to FIG. 6 below, each station 202A-202F of FIG. 2 deposits a pair of gases as needed to complete a single deposition of a layer. The thickness of the layer may be controlled by the speed of rotation of the platen. The repeated rotation of the platen causes additional layers to be accumulated with each pass of the wafer under a multi-zone nozzle. Consequently, the process can be used for high conformity deposition of seed layers and bulk fill of materials.

In a CVD mode, gas from supplies 1202 and 1206 is coupled through splitters 1222 and 1224 to MFCs 1210 and 1212 and into the premix chamber 1228. In the premix chamber, the gases are caused to mix. Generally, these gases are reactants that will react when they are exposed to a heated substrate, i.e., a silane and tungsten hexafluoride reaction to produce tungsten. The mixed gases are coupled from the premix chamber 1228 through a three-way splitter to a second input port of valves 1216, 1218 and 1220. Through manipulation of the valves 1216, 1218, and 1220 into a second valve position, the premixed gases may be applied to one or more (including all) the zones of the multi-zone nozzles 900/1116.

As such, the multi-zone nozzle may be used for both ALD and CVD deposition as disclosed in detail with respect to FIG. 13 below. In short, the apparatus of FIG. 1 may deposit an ALD film using the multi-zone nozzle to form a highly conformal seed layer and then switch to the CVD mode to complete a bulk fill process without stopping the rotation of the platen. As such, considerable throughput performance improvement is achieved. In addition, different reactants could be used during seed and bulk deposition. For example, in an illustrative $WF_6$ chemistry, the ALD mode may use $WF_6$ and $B_2H_6$ to form a first tungsten layer and then switch to $WF_6$ and $SiH_4$ to form a second tungsten layer over the first layer. The second layer will bulk fill a feature with tungsten. The first layer may be a nucleation layer or seed layer. Such a technique would require additional gas supplies and plumbing to adapt the gas distribution system of FIG. 12 to supply the various gases to the nozzles. This $WF_6$ chemistry is illustrative of one possible chemistry, it is to be appreciated that other chemistries may be used.

Figure 6:
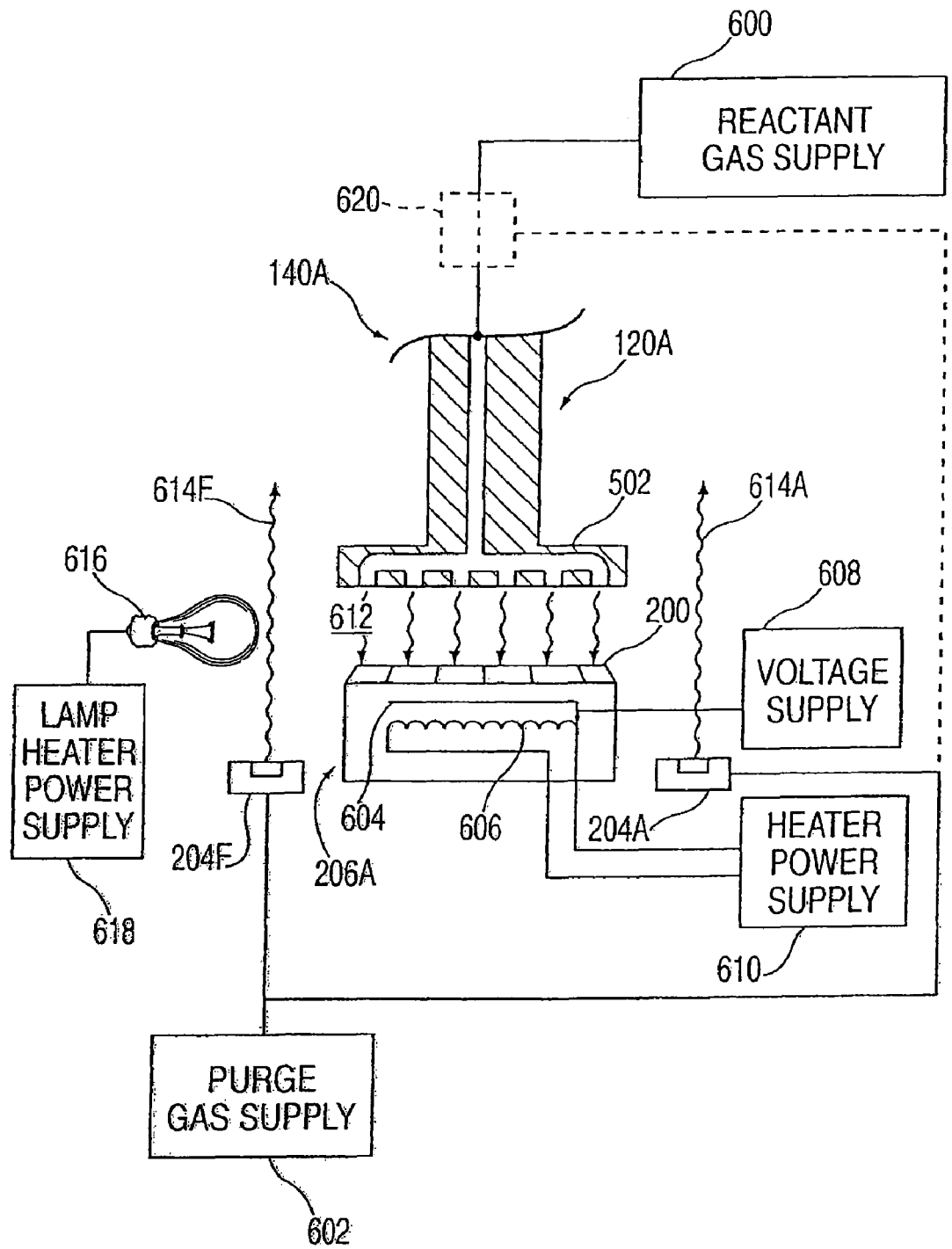
FIG. 6 is a schematic view of one station of the apparatus of FIG. 1.

FIG. 6 depicts a schematic diagram of a single station 140A of the apparatus 100 of FIG. 1. The station 140A comprises a nozzle assembly 120A, a wafer support 206A, and a pair of purge curtain distributors 204A, 204F. The nozzle assembly 120A is coupled to a reactant gas supply 600 (and, possibly, also a purge gas supply 602) and the purge curtain distributors 204A, 204F are coupled to a purge gas supply 602. If the nozzle is a multi-zone nozzle, then it is coupled to a plurality of gas supplies such as shown in FIG. 12.

The wafer support 206A may comprise an electrode 604 and an embedded temperature control element 606. The electrode 206A is coupled to a voltage supply 608 that applies a voltage to the electrode and the wafer (to facilitate chucking of the wafer 200 by electrostatic force). Alternatively, a clamp ring or vacuum could be used to retain the wafer 200 on the support 206A.

The temperature control element 606 may be a resistive heater element that is coupled to a heater power supply 610. The temperature element 606 could also be a fluid jacket or some other temperature control element. The temperature control element 606 is energized to maintain the wafer 200 at a predefined temperature. Alternatively, or in addition to the embedded element 606, one or more heater lamps 616 and a lamp heater power supply 618 may be used to heat the wafer 200. If a process required wafer cooling, then the temperature control element 606 would be a cooling plate or element. The wafer support could contain both a heating and cooling element that can be used to selectively heat or cool a wafer.

Furthermore, external energy sources such as a laser, a microwave power source, or a RF power source may be used in pulse or steady state mode to activate the precursor used in the reaction, i.e., additional energy sources can be used to activate oxygen in the formation of $Al_2O_3$ using an ALD technique.

In operation, using a single zone nozzle, the wafer is positioned on the support 206A and retained. A reactant gas (e.g., silane) is supplied to the nozzle assembly 120A. The gas is typically supplied as a short pulse or burst of gas 612 that exits the showerhead 502 proximate the wafer 200. Alternatively, a continuous flow of purge gas may be supplied from gas supply 600 and intermittent bursts of reactant gas may be injected into the continuous flow of purge gas using a valve 620. The temperature of the wafer 200 is maintained by the temperature control element 606 to facilitate adsorption of the silane on the surface of the wafer 200. Purge gas is continuously supplied to the purge curtain distributors 204A and 204B such that a curtain 614A and 614F of purge gas is formed on either side of the wafer support 206A. The curtains 614A and 614F ensure that the reactant gas 612 is constrained to a volume near the wafer support 206A.

Figure 7:
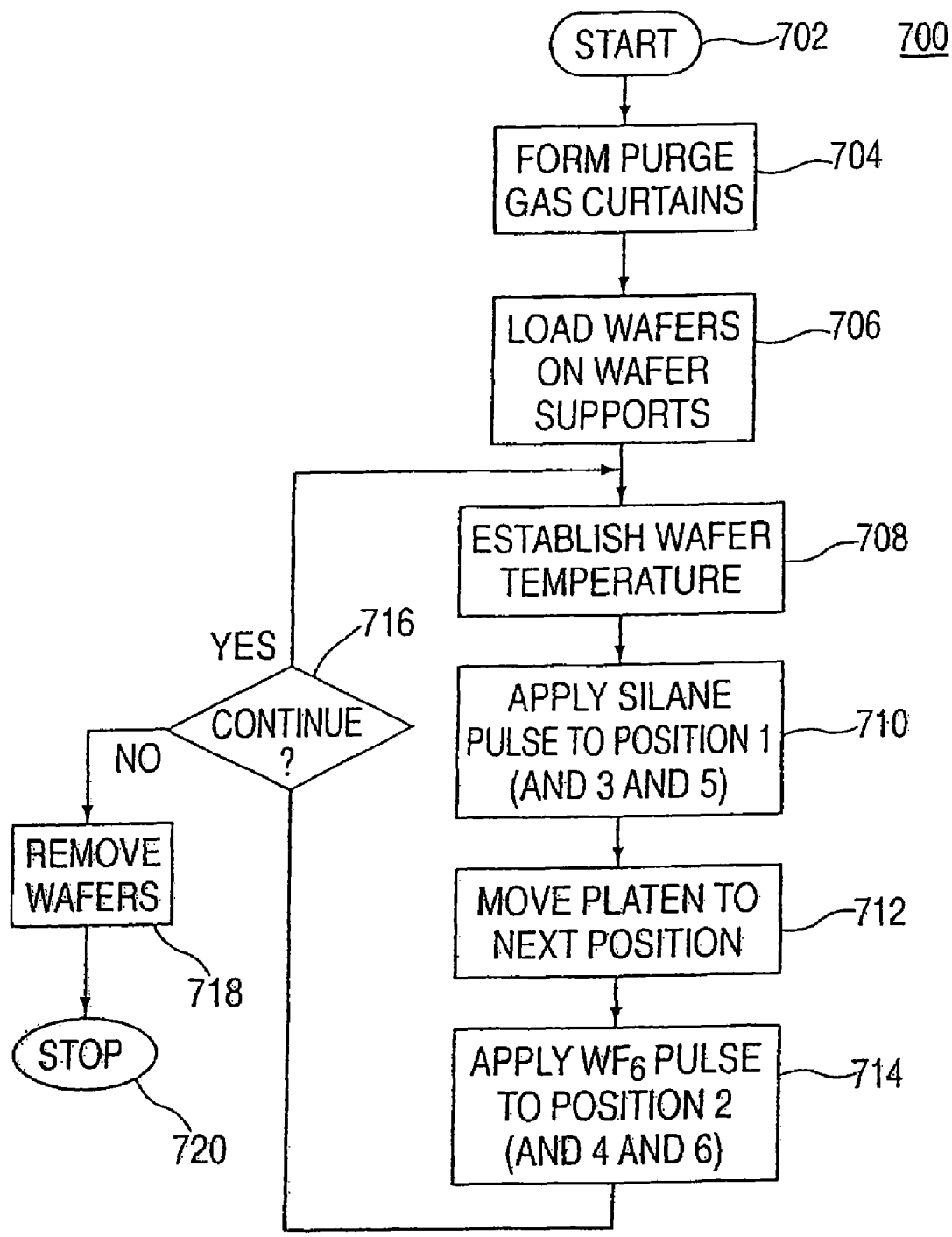
FIG. 7 depicts a flow diagram of the operation of one embodiment of the present invention.

FIG. 7 depicts a flow diagram of a method 700 of operation for the apparatus 100 as controlled by controller. The method 700 represents the operation of the apparatus 100 for depositing a tungsten layer upon a semiconductor wafer using a reaction between $SiH_4$ and $WF_6$. In this example, the tungsten deposition is repeated three times (i.e., one pass through a six station ALD apparatus 100) to form a relatively thin tungsten layer. To increase the thickness, a wafer may be repeatedly processed by the six stations.

The method 700 begins at step 702 and proceeds to step 704 wherein the purge gas curtains are formed between the stations. These curtains are maintained throughout the remaining steps of the method. At step 706, wafers are loaded onto each wafer support to fill all the wafer processing positions. Each position is defined by a nozzle assembly, i.e., position 1 is beneath nozzle assembly 120A, position 2 is beneath nozzle assembly 120B, and so on. In step 706, as each wafer is loaded, a retention force is applied to retain the wafer on the support. At step 708, the wafer temperature is set at each position, then at step 710, a pulse of $SiH_4$ is applied to the wafer in positions 1, 3 and 5. After the gas is applied at positions 1, 3 5, the platen is turned, at step 712, to the next position. At step 714, a pulse of $WF_6$ is applied to the wafers in positions 2, 4 and 6. At step 716, the method queries whether the processing is to continue. If the query is affirmatively answered, steps 708-714 are repeated to deposit another tungsten layer, e.g., a mono-layer. If the query is negatively answered, the wafers are unloaded at step 718 and the method stops at step 720. The foregoing process is described having the steps of the process performed in sequential order, however, one or more of the steps may be performed simultaneously and such a process is considered to be within the scope of the invention.

Alternatively, wafers may be loaded one at a time into the apparatus. As each wafer is loaded, the temperature can be set and the silane adsorbed upon the wafer. After the platen is rotated, the $WF_6$ may be applied to the wafer, and a new wafer positioned at position 1 for silane adsorption. As each new wafer is added to the apparatus, a process can be accomplished at each position. Once all the positions are filled with wafers, the processing may be applied at each position as the platen is rotated.

After a pass through the method 700, both reactant gases (e.g., $SiH_4$ and $WF_6$) have been dispensed over the wafer substrates 306 in short bursts. After each burst of reactant gas, a purge gas such as argon may be applied through each nozzle assembly or the purge gas may be continuously applied. As such, steps 710 and 714 may each be followed by a flow of purge gas. Reactant gases are prevented from mixing outside their respective stations by the purge gas curtains. The aforementioned method steps 708 through 714 may be repeated between 10 and 50 cycles in order to achieve a desired deposition of thickness of tungsten on the wafer.

Other processing methods may be employed by this embodiment of the invention. One such method is to continuously flow reactant gases (and/or purge gases) from the nozzle assemblies while separating the stations with the inert gas purge curtains. The platen would be continuously rotated such that a different reactant gas would be applied to a wafer at each position for a time period defined by the rotation speed of the platen. Employing this processing method, less than 30 cycles may be required before the desired deposition thickness is formed on the wafers. To enhance wafer throughput, the platen rotation speed may be modulated in a sinusoidal pattern such that rotation is slowed as a reactive gas is being applied and rotation speed is increased when the wafers are passing through a purge gas curtain.

In a further embodiment of the invention, the stations may be adapted to perform a complete metallization step as well as other integrated circuit fabrication process. For example, positions 1 and 2 could be used to deposit a first tungsten layer by having a wafer repeatedly visit position 1 for a $SiH_4$ application and position 2 for a $WF_6$ application. Once a first layer is complete, the wafer can be moved to position 3 where a hydrogen reduced tungsten bulk deposition process could be performed to deposit a second layer upon the first layer. Stations 4, 5 and 6 could be used for processing a second set of wafers in a similar manner.

In another embodiment of the invention using single zone nozzles, each station is supplied with both reactant gasses and a purge gas. Each reactant gas is simultaneously applied to a wafer synchronously, while the wafer is stationary. The gases are applied using an ALD technique of short bursts of gas followed by purge gas application. For such synchronous operation with the same gas being applied at all stations simultaneously, the purge gas curtains may be unnecessary. To complete a metallization process, bulk deposition at all the stations may follow the ALD deposition process.

Furthermore, the process may be adapted to load all the wafers into the apparatus, set the process temperature and then soak all the wafers in a first soaking gas. Such an initial process may deposit a silicide layer (e.g., titanium silicide), upon the wafer. The silicide layer deposition is followed by a purge step where a purge gas is applied to the wafers through all the nozzles. Thereafter, a first reactant gas is supplied through all the nozzles as the platen rotates, followed by an application of a second reactant gas. Another reactant gas or a purge gas may be applied prior to the process ending. In this manner, the apparatus is capable of deposing a first and second layer, where, for example, a silicide layer can be deposited prior to depositing a nucleation layer.

Figure 13:
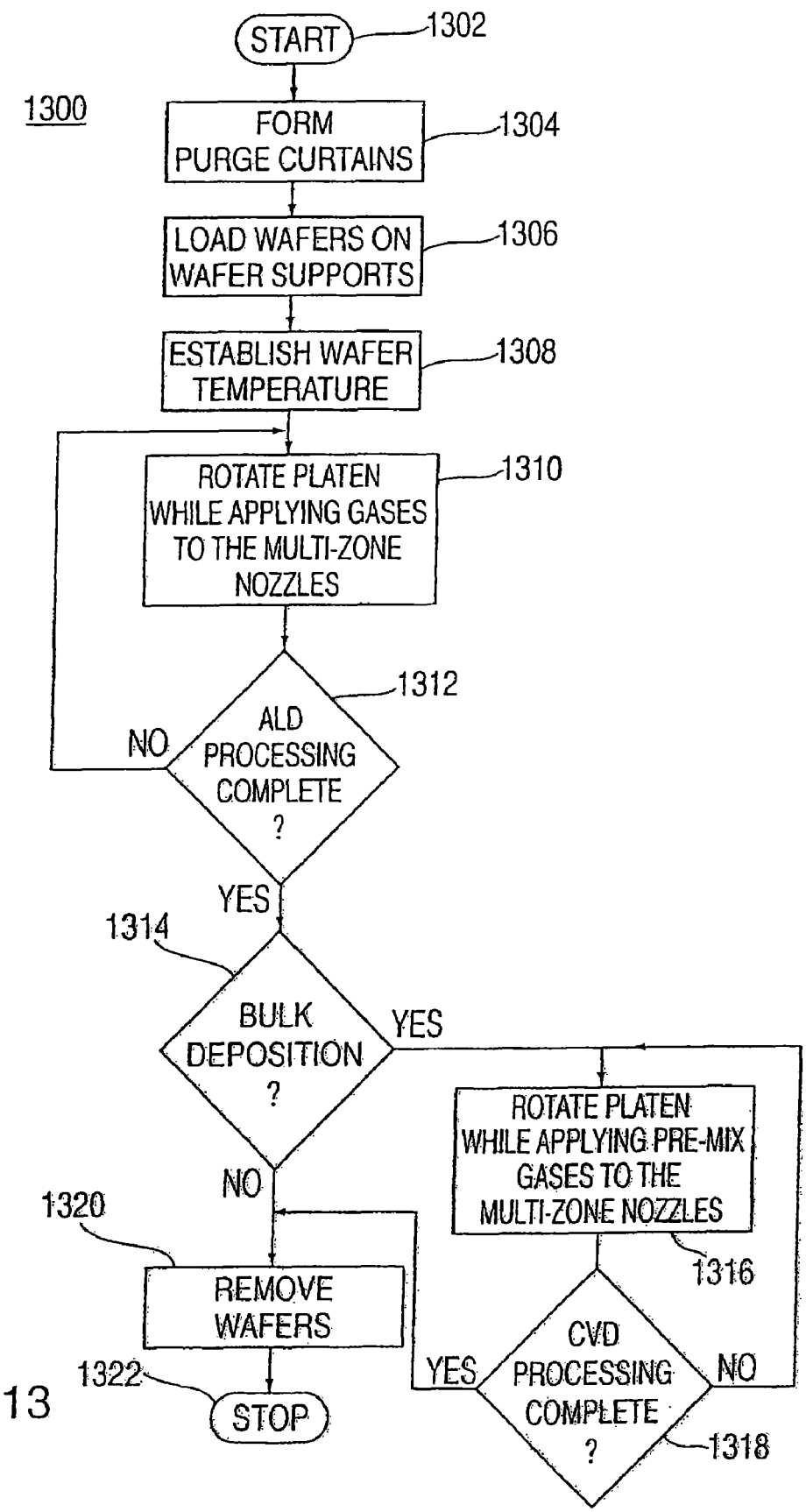
FIG. 13 is a flow diagram of the operation of an embodiment of the invention that dispenses gas in a chamber using a multi-zone nozzle.

FIG. 13 depicts a flow diagram of a process 1300 for depositing a layer using a multi-zone nozzle. As one embodiment of the process, the process is described as used to deposit a first tungsten layer using an ALD mode, followed by an optional tungsten bulk fill process using a CVD mode. Those skilled in the art will realize that the process 1300 may be adapted to use various other gases to deposit other films.

The process 1300 begins at step 1302 and proceeds to step 1304 wherein the purge curtains are formed. At step 1306, the wafers are loaded onto the wafer supports. At step 1308, the apparatus 100 establishes an appropriate wafer temperature for each wafer. At step 1310, the platen is rotated and the various gases are applied to the multi-zone nozzles. In one embodiment, the first zone encountered by the wafer as it rotates into each station delivers silane, the second zone delivers a purge gas and the third zone delivers tungsten hexafluoride. As the wafer passes beneath the nozzles that disperse these gases, the process operating in the ALD mode forms a first tungsten layer. The rotation speed of the platen can be adjusted to increase or decrease the thickness of the deposited layer. At step 1312, the process 1300 queries whether the ALD mode processing is complete. If the query is negatively answered the process continues to rotate the platen and apply the gases to continue to form the first layer. The more stations that a wafer passes through, the thicker the first layer becomes.

When the query of step 1312 is affirmatively answered, the process proceeds to the query in step 1320. The query in step 1320 requests whether an optional bulk deposition process is to be initiated using a CVD mode. If the query of step 1314 is negatively answered, the process continues to step 1320 where the wafers are removed from the apparatus and the process is stopped at step 1322. However, if the query is affirmatively answered, the process 1300 proceeds to step 1316. At step 1316, the platen is rotated while gases are applied that will bulk fill the features on the wafer i.e., a second layer is deposited upon the first layer. The bulk fill process may be a CVD process wherein one or more zones has a mixture of gases applied to the multi-zone nozzle. The mixed gases, for example, $WF_6$ and $SiH_4$, do not react in the gas phase such that they can be mixed and supplied to the wafer simultaneously. The gases react with one another upon the heated wafer surface to form a tungsten layer. At step 1218, the process queries whether the CVD process is complete. If the query is negatively answered, the process continues the CVD deposition. Otherwise, the process removes the wafers at step 1320 and stops at step 1322.

Although the foregoing description of the method describes the process steps as performed in a sequential order, some of the steps may be performed simultaneously or in a different order to deposit one or more layers of material in accordance with the invention. Furthermore, the apparatus 100 can also be used to deposit layers of material separately using either the CVD mode or the ALD mode.

Figure 8:
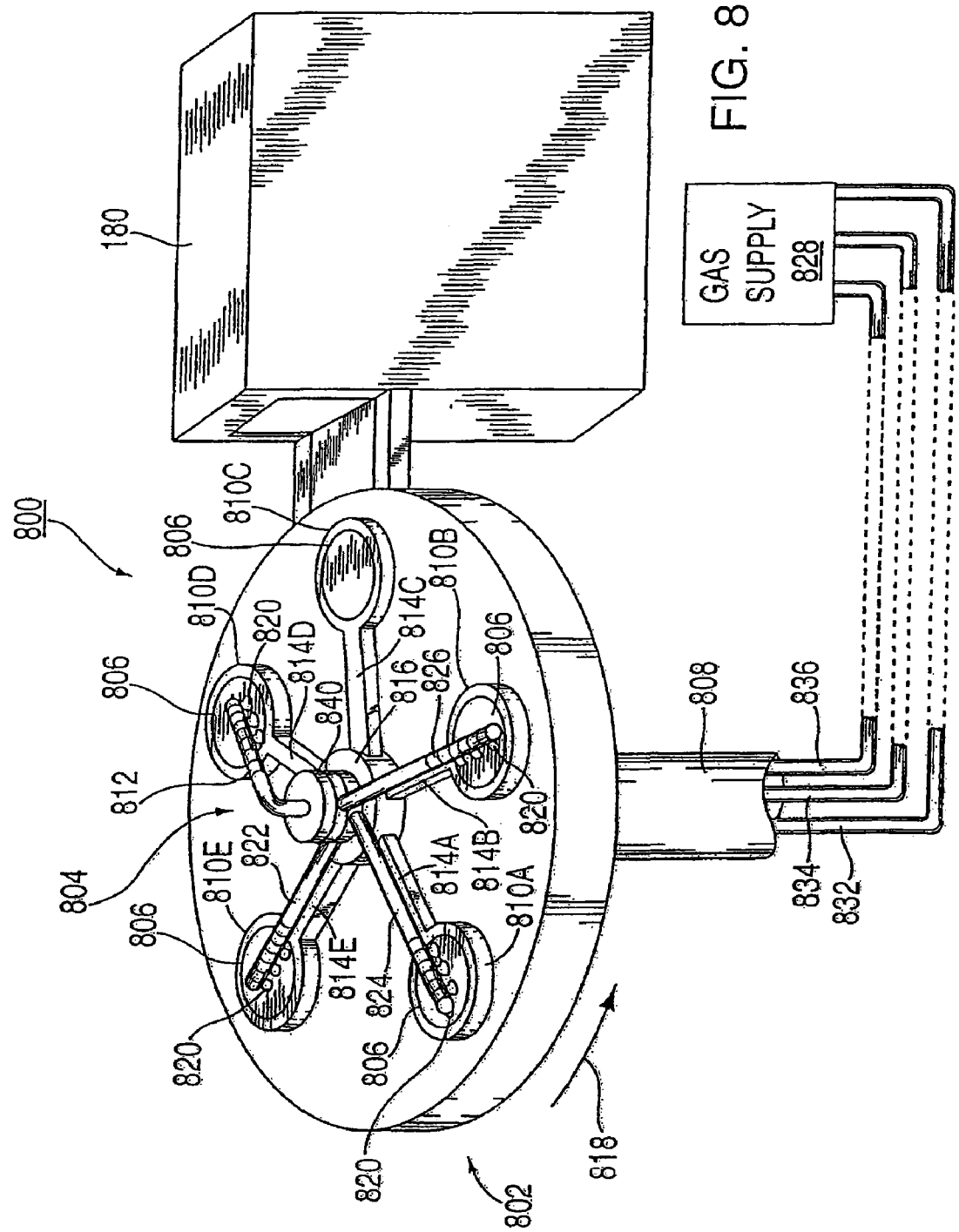
FIG. 8 is a perspective view of a second embodiment of an atomic layer deposition apparatus according to the present invention.

Referring to FIG. 8, another embodiment of the present invention is shown, wherein the gas distribution system 804 radiates outward from a central hub 830 that is mounted to a rotating platen assembly 802. In this embodiment, as in the previous, a wafer transfer module 180, including a wafer transfer robot (not shown), is coupled to the apparatus 800. The apparatus 800 is comprised of a rotating platen assembly 802 and a gas distribution system 804. The platen assembly 802 comprises a plurality of wafer supports 810A-810E and rotates, for example, in the direction of the arrow 814. The platen 802 and wafer supports 810A-810E are similar to platen 102 and supports 206A-206F of FIG. 2. As such, the platen and its supports shall not be described further. During processing, the platen may rotate to position the wafers beneath the gas sources or, alternatively, the platen may be stationary and the gas sources may be moved into position above the wafers.

The gas distribution system 804 comprise a plurality of arms or wands 812, 822, 824 and 826, hereinafter referred to as gas dispensing arms, that transmit gas from the central hub 816 to a region above the wafers. Although four arms are depicted, more or less arms may be used depending upon the processes that are to be performed. The gas dispensing arms 812, 822, 824 and 826 may, for example, rotate above the platen in a direction that is opposite to the direction of rotation of the platen assembly 802. The gas dispensing arms 812, 822, 824 and 826 may also rotate in an indexed manner, i.e., rotate using an intermittent rotational movement wherein the arms rotate into alignment with a particular wafer, stop, dispense gas, and then move to another wafer location.

The gas dispensing arms 812, 822, 824 and 826 project from a series of stacked gas manifolds 840 that form a portion of the central hub 816. The manifolds 840 may rotate at different rates of speed independent of each other. Each segment of the manifold is stacked upon the other segments with one or more of the gas dispensing arms 812, 822, 824 and 826 projecting from the sides or top of the hub 816. A series of nozzles 820 are located along the bottom of each of the gas dispensing arms 812, 822, 824 and 826 near the end thereof to allow gas to exit from the respective gas dispensing arms. The nozzles 820 are designed to project the gas downward at the substrate support 810A-810F. The gas dispensing arms 812, 822, 824 and 826 are coupled to a gas supply 828 via gas supply lines 832, 834 and 836. Each gas-dispensing arm 812, 822, 824 and 826 may contain a different reactant gas or inert gas for use in the atomic layer deposition process.

In practice, wafers 806 are transferred from the wafer transfer module 180 by the wafer transfer robot (not shown) onto the wafer supports 810A-810E. The wafer supports 810A-810E secure the wafers 806 so as to prevent movement. Once secured, the wafer supports 810A-810E are indexed until all the stations are loaded. A gas-dispensing arm 812, 822, 824 or 826 is queued to pass over at least one of the wafer supports 810A-810E. As the gas-dispensing arm 812, 822, 824 or 826 passes over at least one of the wafer supports 810A-810E, the arm 812, 822, 824 or 826 dispenses a first reactant gas (e.g., silane) over the wafer 806, beginning the ALD process. The wafers 806 will adsorb some of the reactant gas and the rest will be purged away by an inert gas supplied by another gas dispensing arm passing over the wafer support. Subsequently, a second reactant gas dispensing arm 812, 822, 824 or 826 moves over the top of the wafer supports 810A-810E and dispenses a second reactant gas (e.g., $WF_6$).

The second reactant gas reacts with the adsorbed gas on the wafer 806 to form a thin film on the wafers 806. Another one of the gas dispensing arms 812, 822, 824 or 826 that dispenses an inert purge gas is also caused to rotate over the wafer supports 810A-810E dispensing inert gases so as to prevent the accumulation of the reactant gas proximate the wafers. The inert gas may also be dispensed in intervals so as to prevent stray reactant gases from contaminating other wafers 806 on the substrate supports 810A-810E. Purge gas could be supplied continuously from all the arms and intermittent bursts of reactant gas may be coupled to the appropriate arm at an appropriate time.

The rotational motion of the platen assembly 802 during processing may be continuous, intermittent (indexed) or stationary. The motion of the gas distribution arms 812, 822, 824 and 826 may be continuous, intermittent or the arms may be stationary. Generally speaking, either the arms or the platen rotate relative to one another to facilitate gas application to the wafers. If the arms are rotatable, each gas-dispensing arm 812, 822, 824 and 826 in one embodiment of the invention rotates independent of the others as well as being independent of the platen rotation. In another embodiment, the arms may rotate in unison. Each of the gas dispensing arm's movements may be adjusted so as to achieve optimum performance during the atomic layer deposition process. For example, the movement may be modulated in a sinusoidal manner to slowly rotate the arms as gas is being dispensed and rapidly rotate the arms as the arms are being moved into position over the next wafer.

As described above, the apparatus and method according to the present invention is more efficient and effective compared to the conventional, single chamber apparatus and methods. Therefore, layers of material formed on wafers by the present invention are more uniform and more quickly produced than by other methods.

Although various embodiments that incorporate the teachings of the present invention have been shown and described herein. Those skilled in the art can readily devise many other varied embodiments that still incorporate these teachings.

What is claimed is:

1. A method of depositing a material on a wafer comprising:
   introducing a first deposition gas proximate a wafer disposed a first deposition position within a vacuum deposition chamber, the vacuum deposition chamber having a second deposition position disposed adjacent the first deposition position;
   introducing a first deposition gas proximate the wafer while positioned;
   providing a first gas curtain between the first deposition position and a second deposition position within the vacuum deposition chamber; and
   moving the wafer to the second deposition while maintaining a relative position between the first gas curtain and the wafer.

2. The method of claim 1, wherein the first gas curtain is positioned between the second deposition position and a third deposition position defined within the vacuum deposition chamber when the wafer is in the second deposition position.

3. The method of claim 1 further comprising:
   providing a second gas curtain between the first deposition position and the second deposition position while the wafer is in the second deposition position.

4. The method of claim 1, wherein the first gas used at the first deposition position is silane and the second gas used at the second deposition position is tungsten hexafluoride.

5. The method of claim 1, wherein the first deposition gas and the second deposition gas forms a layer through an atomic layer deposition process.

6. The method of claim 1, wherein a chemical vapor deposition process is performed in at least one of the deposition positions.

7. The method of claim 1, wherein providing the first gas curtain further comprises:
   flowing a separation gas in an orientation that remains stationary relative to the wafer as the wafer moves from the first deposition position to the second deposition position.

8. The method of claim 1, wherein, at each deposition, supplying a continuous follow of purge gas having a reactant gas intermittently inserted into the continuous flow of purge gas as a burst of reactant gas.

9. The method of claim 1, wherein moving the wafer to the second deposition position further comprises:
   rotating a platen comprising a plurality of wafer supports about its central axis, wherein the wafer is disposed on one of the wafer supports.

10. The method of claim 1, wherein moving the wafer to the second deposition position further comprises:
    rotating the wafer relative a centerline of the vacuum deposition chamber.

* * * * *